(12) United States Patent
Manolescu et al.

(10) Patent No.: US 6,219,279 B1
(45) Date of Patent: Apr. 17, 2001

(54) NON-VOLATILE MEMORY PROGRAM DRIVER AND READ REFERENCE CIRCUITS

(75) Inventors: Mihai Manolescu, San Jose, CA (US); Gianpaolo Spadini, Mesa, AZ (US)

(73) Assignee: Zilog, Inc., Campbell, CA (US)

( * ) Notice: Subject to any disclaimer, the term of this patent is extended or adjusted under 35 U.S.C. 154(b) by 0 days.

(21) Appl. No.: 09/430,474

(22) Filed: Oct. 29, 1999

(51) Int. Cl.$^7$ .................................................. G11C 16/06
(52) U.S. Cl. .................. 365/185.21; 365/185.2; 365/185.18; 365/196; 365/205; 365/210
(58) Field of Search .................. 365/185.21, 185.18, 365/196, 205, 210

(56) References Cited

U.S. PATENT DOCUMENTS

| | | |
|---|---|---|
| 4,785,423 | 11/1988 | Skupnjak et al. . |
| 5,187,392 | 2/1993 | Allen . |
| 5,390,147 * | 2/1995 | Smarandoin et al. ............... 365/185 |
| 5,398,203 | 3/1995 | Prickett, Jr. . |
| 5,485,422 * | 1/1996 | Bauer et al. .......................... 365/168 |
| 5,487,045 * | 1/1996 | Trodden ................................ 365/205 |
| 5,528,546 * | 6/1996 | Chao et al. ....................... 365/185.21 |
| 5,532,964 * | 7/1996 | Cernea et al. ................... 365/189.09 |
| 5,568,425 * | 10/1996 | Song ................................ 365/185.33 |
| 5,600,594 * | 2/1997 | Padoan et al. ................... 365/185.24 |
| 5,638,322 * | 6/1997 | Lacey ................................. 365/185.2 |
| 5,642,310 | 6/1997 | Song . |
| 5,652,722 | 7/1997 | Whitefield . |
| 5,654,918 * | 8/1997 | Hammick .......................... 365/185.2 |
| 5,748,531 | 5/1998 | Choi . |
| 5,773,997 * | 6/1998 | Stiegler .................................. 327/53 |
| 5,828,616 * | 10/1998 | Bauer et al. .......................... 365/210 |
| 5,912,838 * | 6/1999 | Chevallier ....................... 365/185.03 |
| 5,946,236 | 8/1999 | Kajitani . |

\* cited by examiner

Primary Examiner—Viet Q. Nguyen
(74) Attorney, Agent, or Firm—Skjerven Morrill MacPherson LLP

(57) ABSTRACT

A method and circuits, in a non-volatile memory system such as EPROM, for limiting bit line current during programming that includes biasing a driving transistor to mirror a maximum desired current into the driving transistor from a mirroring transistor connected to a controlled current source. This technique is useful, for example, during hot electron programming of a floating gate memory cell to limit bit line current caused by snap back of the cell through which a relatively high current is passed. In a preferred embodiment, the state of a cell is monitored while being programmed by comparing the voltage of the bit line with a reference voltage that is developed in a circuit containing a replica of the driving transistor. Since characteristics of the driving and reference transistors are the same from wafer to wafer, or batch to batch, the reference voltage varies to compensate for variations in characteristics of the driving transistor among integrated circuit chips from different wafers and manufacturing batches.

11 Claims, 4 Drawing Sheets

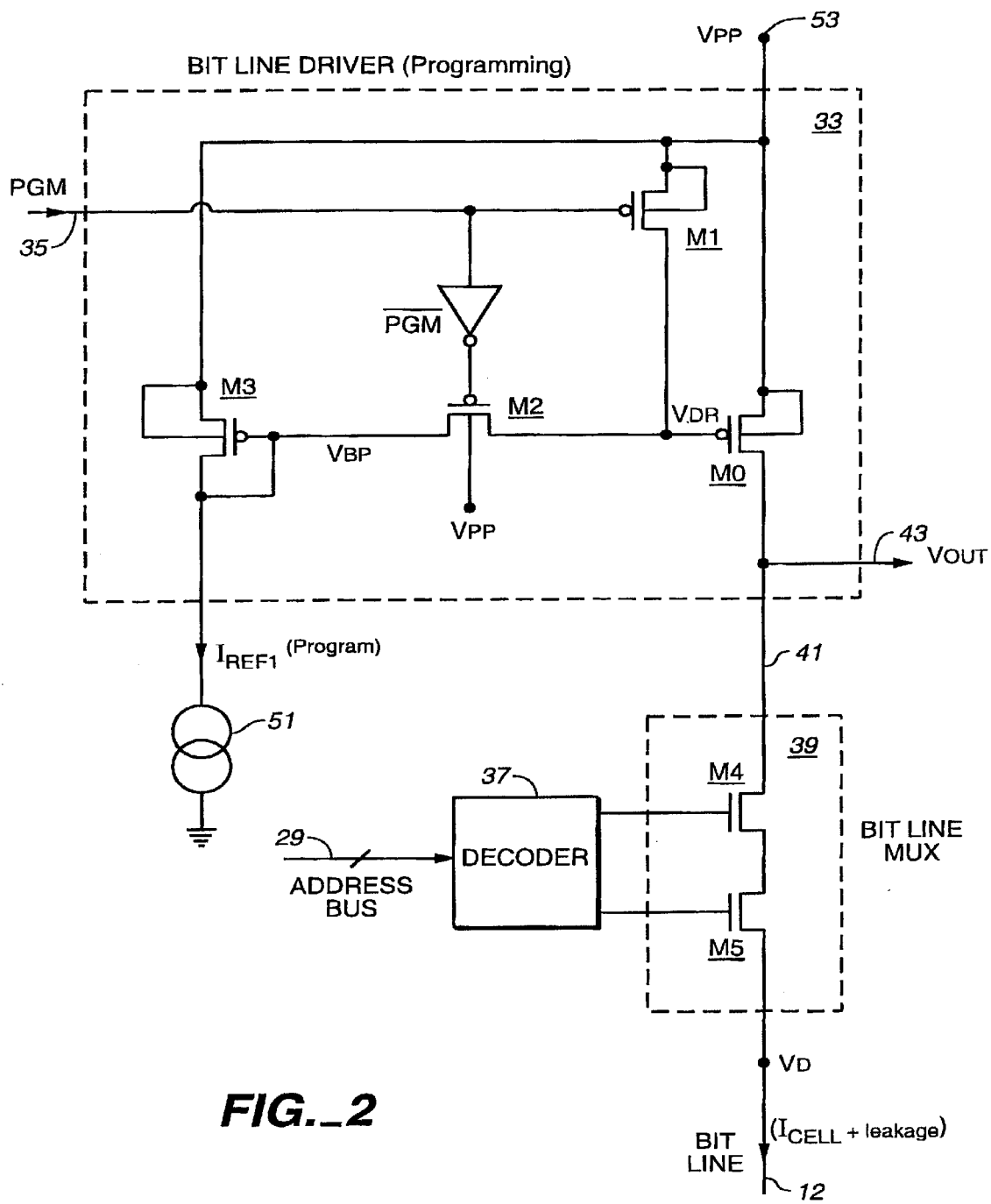
FIG._2

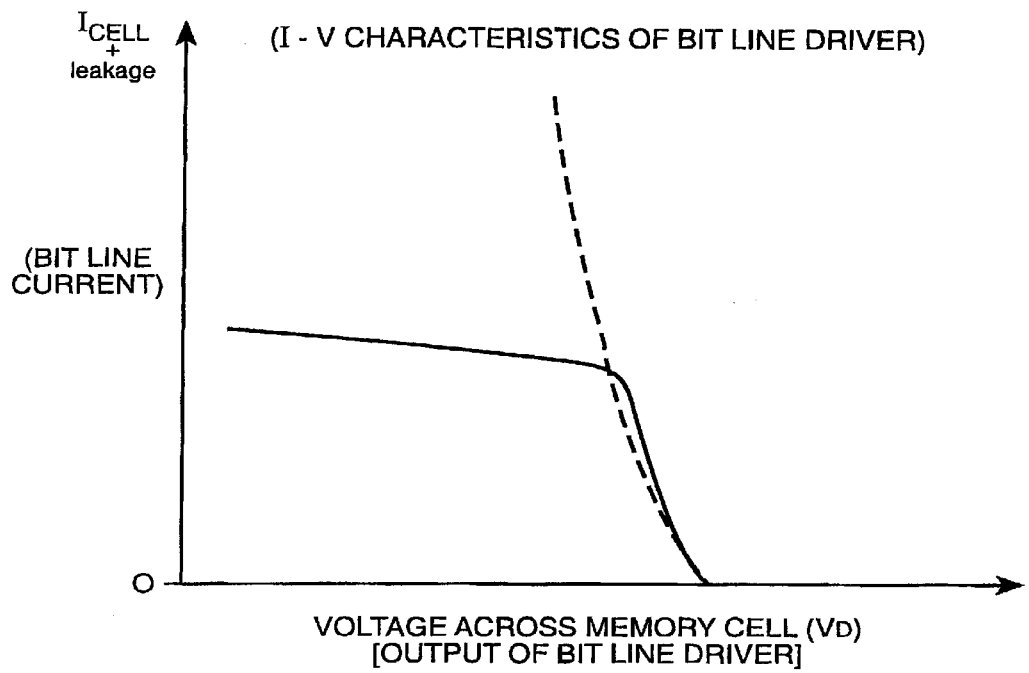
FIG._3
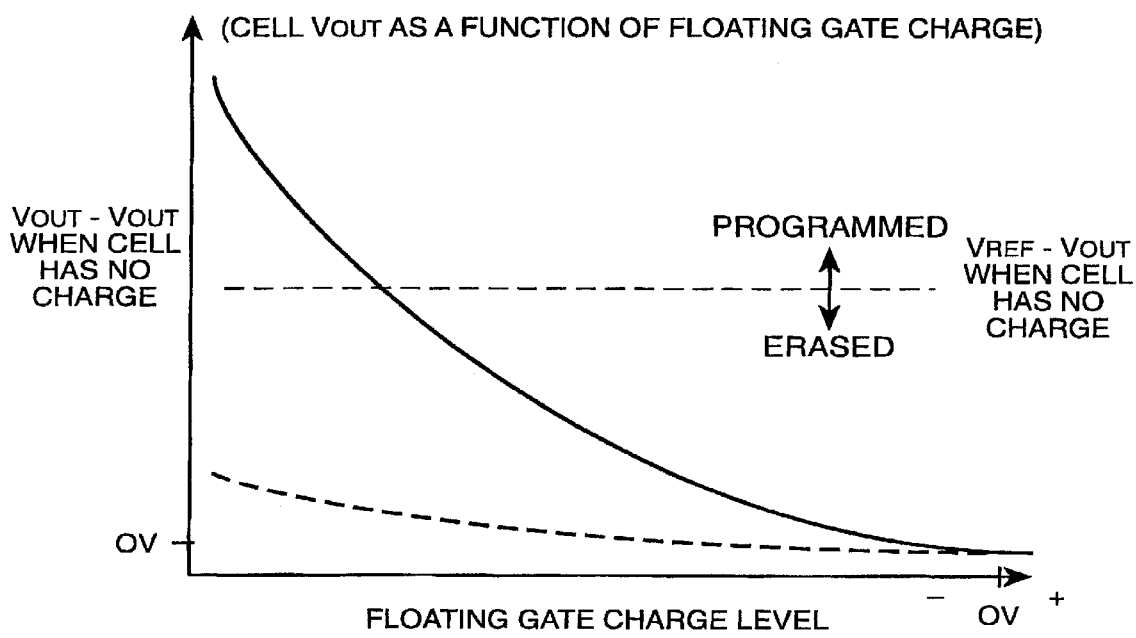
FIG._4

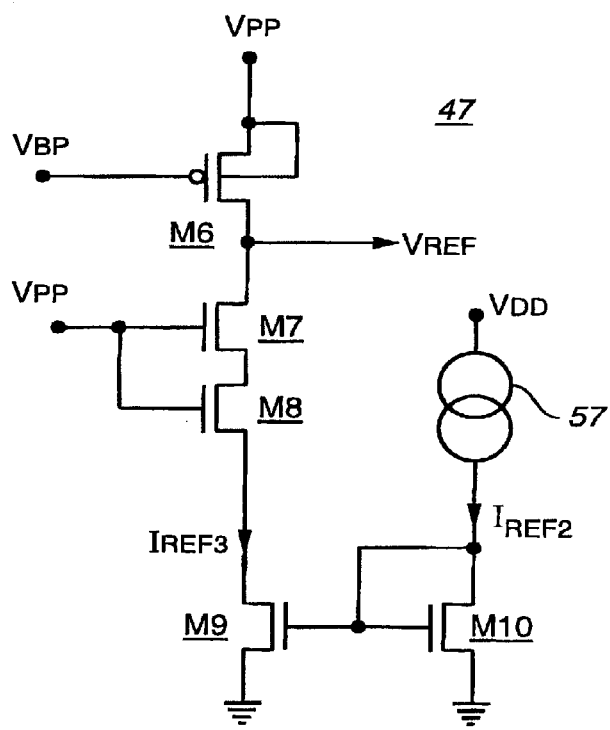
FIG._5
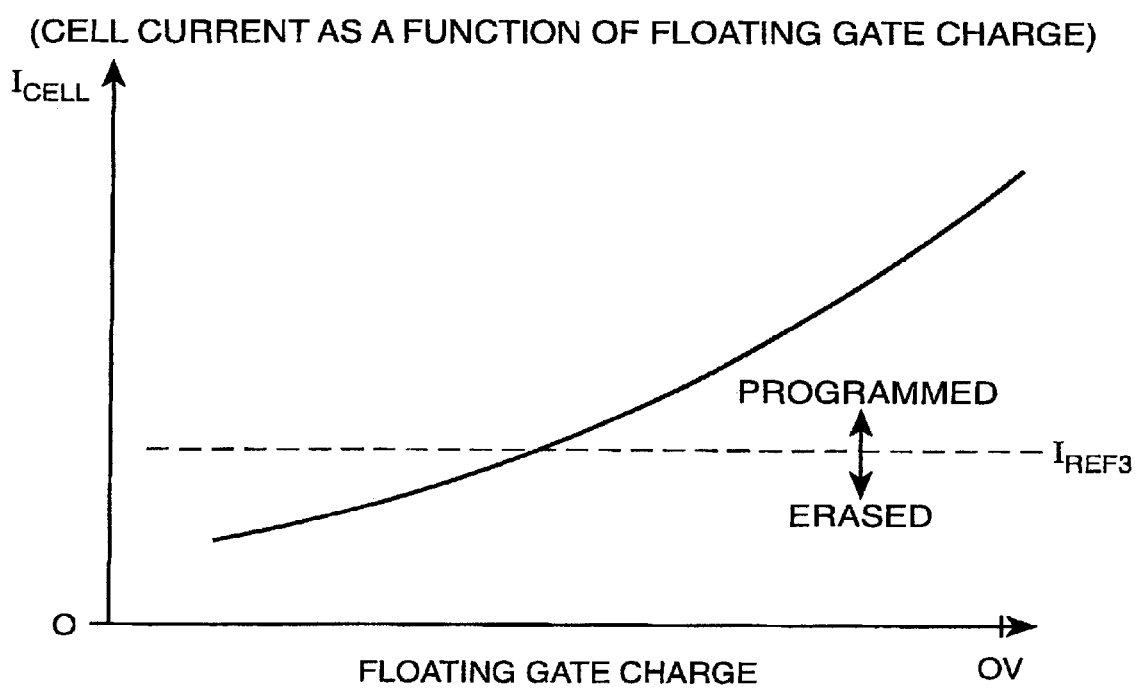
FIG._6

NON-VOLATILE MEMORY PROGRAM DRIVER AND READ REFERENCE CIRCUITS

BACKGROUND OF THE INVENTION

This invention is in the field of non-volatile memories of the type having floating gates in the memory cells, such as EPROM, EEPROM and flash EEPROM systems, and, more specifically, directed to controlling the level of bit line current during programming of such memories and to generating a reference level used during reading the programmed states of cells in such memories.

Two techniques are commonly used for programming a floating gate memory cell. One technique causes electrons traveling through the cell's channel, from its source to its drain, to be imparted with enough energy to be injected onto the floating gate through a gate dielectric positioned therebetween. This is often termed "hot electron injection" programming. Another technique is to place appropriate voltages on the cell's source, drain and control gate to cause electrons to tunnel through the gate dielectric. This is usually referred to as "Fowler-Nordheim tunneling." Each technique has its own advantages and disadvantages.

Hot electron programming requires that relatively high currents be passed through the cell in order to impart enough energy to electrons for injection onto the floating gate. This high current can cause a parasitic n-p-n bipolar transistor associated with the cell transistor to turn-on (snap back) and draw an excessive level of current through the cell and its column bit line. Therefore, others have attempted to limit current through bit lines during programming. One technique includes placing a resistor in the path of each bit line to limit it's current. The size of the resistor is chosen to be large enough to limit the current that may flow through a bit line and an addressed cell connected thereto but must also be made small enough to allow efficient programming. This necessary trade-off limits the effectiveness of the series resistance to control the high bit line current that can result when the addressed cell transistor goes into a snap back mode. Others have used active circuits connected to the bit lines but their use has proven difficult to adequately control the bit line current.

The state of a floating gate memory cell is usually read by impressing given voltages across the cell and on its control gate, and then reading the resulting current that flows through the cell. The amount of current that flows through the cell is related to the amount of charge on its floating gate. This current, or a voltage proportional to the current, is measured and compared with at least one reference that provides a breakpoint between programmed states of the cell. The result of this comparison is to measure the state into which the cell has been programmed.

SUMMARY OF THE INVENTION

According to a principal aspect of the present invention, a limit is placed on the amount of current that can be drawn through a bit line during the programming of one of its cells by biasing a bit line driving transistor to mirror the maximum desired current from another transistor and reference current source into the program driving transistor. This thus limits the maximum current through the cell being addressed, and is useful, for example, during hot electron programming when a relatively large current passing through the cell can initiate snap back. This prevents damage to the cells that can result from excessive currents being passed through them during programming, and also extends their life in terms of a maximum number of programming cycles that they can endure.

According to another aspect of the present invention, the state of a cell is monitored during programming by comparing the voltage of its bit line with a reference voltage that is generated with a circuit containing a transistor that is a replica of the memory array driving transistors. As a result, the current-voltage characteristic of the reference transistor is the same as that of the bit line driving transistors for a given integrated circuit chip, even as those characteristics vary among different chips from different wafers, and/or from wafers made in different processing batches. Differences between the monitored bit line voltage and the locally generated reference voltage are thus proportional to the programmed state of the cells and not the result of variations among different circuit chips.

In a preferred form, both of these aspects are combined together into a single bit line program driving and simultaneous reading circuit, wherein an excessive bit line current and an erroneous read reference level are avoided. The life of the memory and reading accuracy are then both improved. Alternatively, either of these improvements over existing non-volatile programming and reading techniques may be employed without the other.

In a specific example, the driving transistors, and thus also the reference level transistors in the improved reference generation circuit, are p-mos devices. This allows much better control of the driving transistor biasing and current control characteristics during programming than results ifn-mos devices are used for the driving transistors, since the sources of the p-mos transistors are connected to the programming voltage supply that is substantially constant. The gate-to-source voltage of the p-mos transistor drivers, which controls the level of conduction through them, are then accurately controlled by applying bias voltages to their gates as part of the current mirroring circuit.

Additional features and advantages of the present invention, in its various aspects and forms, are given in the following description of its embodiments, which description should be taken in conjunction with the accompanying drawings

BRIEF DESCRIPTION OF THE DRAWINGS

FIG. 2 is an example schematic circuit diagram of the bit line driver and bit line mux blocks of the system of FIG. 1;

FIG. 3 shows curves of the voltage-current characteristic of bit line driver of the system of FIG. 1 that is operated with the circuits of FIG. 2 (solid line), compared with the cell voltage-current characteristic of existing systems (dashed line);

FIG. 4 shows curves of the read output voltage characteristic of the circuit of FIG. 2 solid line) as a function of an addressed cell's floating gate charge, compared with that voltage characteristic of existing circuits (dashed line);

FIG. 5 is an example schematic diagram of an electronic circuit connectable with that of FIG. 2 to provide a reference voltage for reading the state of an addressed memory cell; and FIG. 6 shows a curve of the current through an addressed cell of the system of FIG. 1 that is operated with the circuit of FIG. 2 and with the reference circuit of FIG. 5, as a function of the cell's floating gate charge.

DESCRIPTION OF THE PREFERRED EMBODIMENTS

Figure 1:
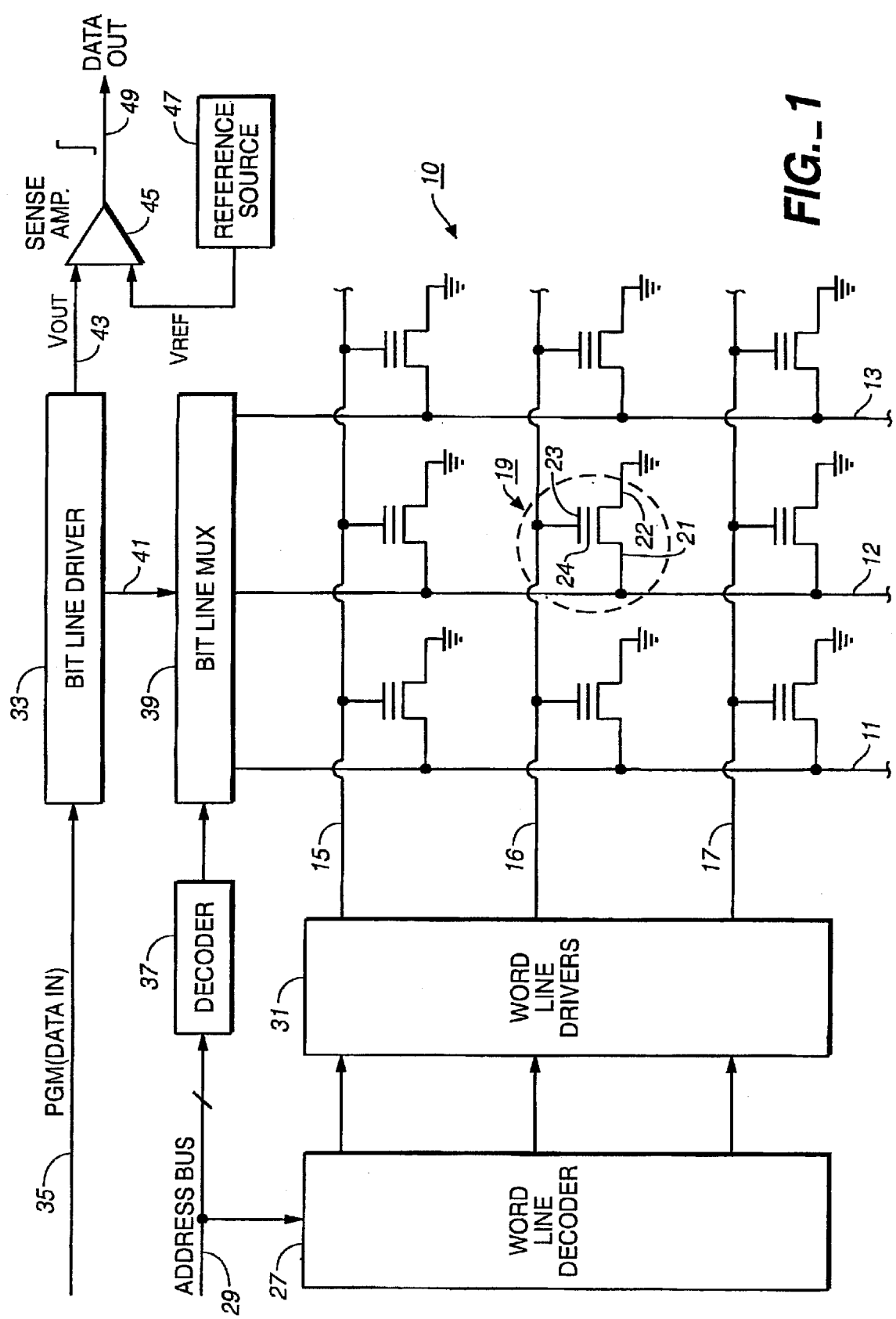
FIG. 1 is a schematic block diagram of a memory system including the improvements of the present invention.

FIG. 1 illustrates a typical EPROM system in which the various features of the present invention are implemented.

An array 10 of rows and columns of floating gate, non-volatile memory cells is formed with a large number of orthogonally arranged word and bit lines, three bit lines 11–13 and three word lines 15–17 being illustrated. A memory cell is connected at each intersection of a bit and word line. An example one of these cells 19 has a drain 21 connected to the bit line 12, a source 22 connected to a reference level such a ground potential, and a control gate 23 connected to the word line 16. A floating gate 24 is programmed by electrons traveling to it through a gate dielectric layer from the memory system substrate when appropriate voltages are applied to the source 22, drain 21 and control gate 23. Programming by hot electron injection is preferred, as previously mentioned. The floating gate 24 is erased by removing electrons from it through the gate dielectric to the substrate by application of a different set of voltages to the memory cell.

One of the word lines 15–17 is selected at a time by a decoder 27 as specified by a portion of an address put on an address bus 29 by a host processor or memory controller (not shown). Circuits 31 place a appropriate voltage on the addressed word line for each of the programming, reading and erasing functions. An appropriate voltage to program, read or erase one or more cells along the addressed word line is applied by the drivers 31 in response to command signals from the controller on control lines (not shown). The voltage of a bit line is similarly provided by a bit line driver 33 over a line 41 to perform a commanded function. The driver 33 also contains a programming driver that is described in detail below. A programming signal PGM is applied on a line 35 form the controller to the programming driver. During a programming operation, when the signal PGM is active, programming of an addressed cell occurs, while when the signal PGM is inactive, programming of an addressed cell does not occur. One of the bit lines 11–13 is selected by a bit line mux 39 for connection with the driving signals on the line 41. The mux 39 operates in response to a column decoder 37 that is connected with the address bus 29.

As described further below, the system of FIG. 1 allows monitoring the programmed state of a cell simultaneously with its programming. An output voltage $V_{OUT}$ is proportional to the current flowing in the bit line that is selected by the mux 39. That current is related to the amount of charge stored on the floating gate of the cell connected to the selected bit line that has been addressed by a proper voltage applied to its word line. A sense amplifier 45 compares that voltage with a reference voltage $V_{REF}$ that is supplied by a reference source 47. The voltage $V_{REF}$ may be a fixed voltage from a regulated on-chip supply, or, preferably, from a supply generated by a circuit of a type described below with respect to FIG. 5.

Although only a small portion of a memory array is shown in FIG. 1 for simplicity of explanation, one arrangement of the array provides a separate bit line driver and associated mux for each of many, such as eight, groups of a plurality of bit lines and the memory cells connected to them. This allows for simultaneous programming or reading of one cell in each group along an addressed word line that is common to all the groups. Each of the groups contains a bit line driver 33, a decoder 37, a mux 39, sense amplifier 45 and reference source 47. The entire memory system of FIG. 1 is contained on a single integrated circuit chip. Indeed, such a memory may be included on a circuit chip with other functional components, such as a driver for an infra-red emitter that are included together in a hand held, battery operated television remote control unit.

The portion of the bit line driver 33 used to provide a program current to selected one of the bit lines is shown in FIG. 2. A transistor M0 is a program driving transistor that connects the line 41 to a programming voltage supply $V_{PP}$. The line 41 is connected to one of the bit lines, in this case bit line 12, by mux 39 having series connected transistors M4 and M5, as a simplified example. The mux 39 operates to select one of the bit lines in response outputs of the decoder 37. In a usual n-mos memory cell array, the program driving transistor is also an n-mos device that is simply turned on by connecting a sufficient voltage to its gate in response to an active program signal, to apply a programming current to the addressed cell, or turned off by removing the gate voltage in response to an inactive program signal. This driving transistor is, in effect, a binary switch having only "on" and "off" conditions.

The driving transistor M0 used in implementing the present invention, on the other hand, has its level of conduction controlled during programming by a bias voltage $V_{DR}$ applied to its gate. When the programming signal PGM is active, the gate of the driving transistor M0 is connected through a transistor M2 to a bias voltage $V_{BP}$ at a gate of a transistor M3. The gate of transistor M3 is connected with its drain, thus causing M3 to act as a resistor, and the bias $V_{BP}$ results from a voltage drop across the transistor M3 that results from a reference current $V_{REF1}$ from a current source 51 connected to its drain and a programming voltage $V_{PP}$ connected to its source. When the programming signal PGM is inactive, during periods when the bit line driver 33 is not in a programming mode, the transistor M2 is turned off and a transistor M1 is turned on to connect the gate of the driving transistor M0 to the voltage supply terminal 53. The driving transistor M0 thus acts as a resistor when programming is not taking place along a bit line to which the driving circuit 33 is connected.

The driving transistor M0 is controlled during programming to be operable within its triode region, rather than being only driven to saturation for maximum conduction, as is the usual case. In order to have better control over that level of conduction during programming, the transistor M0 is preferably a p-mos type. This allows the conduction controlling voltage between its gate and source to be accurately controlled since the source of M0 is connected to the voltage supply terminal 53. If M0 is made to be an n-mos device, its source would be connected to the line 41 and thus would not have a fixed voltage reference during programming. The gate to source voltage would then tend to vary as the current through it changed, thus causing the impedance of M0 to vary even though the bias voltage $V_{DR}$ applied to its gate was fixed. Control of the operation of an n-mos driving transistor would be, as a result, much more difficult.

In addition to the driving transistor M0 being of a p-mos type, each of the other transistors M1, M2 and M3 is preferably a p-mos device. In a specific implementation, all four of the p-mos transistors of the driver circuit 33 are formed in a substrate well that is maintained at the voltage of the supply terminal 53, which is $V_{PP}$ during programming.

Control of a maximum level of current through the driving transistor M0 during programming is accomplished by mirroring the level of $I_{REF1}$ through the transistor M3 to the transistor M0. These two transistors are connected together in a current mirroring circuit, where the maximum current $I_{CELL}$ permitted to flow through M0 and an addressed memory cell is determined by the magnitude of the reference current $I_{REF1}$ multiplied by a ratio of the relative sizes of these transistors. More specifically, $I_{CELL}$ (max.)=$I_{REF1}$ ($W_{M0}/L_{M0}$) ($L_{M3}/W_{M3}$), where L and W denote the lengths and widths, respectively, of the channels of the transistors identified in the subscripts. The maximum value of $I_{CELL}$ is set by choosing the appropriate relative sizes of the transistors M0 and M3 and the level of the reference current $I_{REF1}$. This maximum cell current is chosen to be the slightly greater than the desired cell programming current plus leakage current through other cells of an addressed bit line and through non-addressed bit lines.

Curves of FIG. 3 illustrate the effect of biasing the driving transistor M3 by the current mirroring circuit. The dashed curve shows the current-voltage characteristic of a driving transistor without the biasing provided by the circuit of FIG. 2. In this more typical case, the driving transistor is fully turned on during programming and thus provides a very low resistance path between the programming voltage source and the bit line. If an addressed cell exhibits snap back, for instance, the driving transistor does not provide a limit to the amount of current $I_{CELL}$ that can pass through the cell. The circuit of FIG. 2, however, has a current-voltage characteristic that is shown in FIG. 3 by a solid line. The substantially horizontal portion of the solid curve represents the maximum level of current through the cell, $I_{CELL}$ (max.), plus leakage current that does not pass through the addressed cell. Since the leakage current is substantially constant each time an addressed cell is being programmed, the curve (not shown) for $I_{CELL}$ alone is slightly lower that the solid curve of FIG. 3 by a fixed amount. In addition to the bit line current limiting technique reducing the wear on the memory cells during programming, it also allows a smaller driving transistor M0 to be used since it need not be formed to handle such large currents.

A typical EPROM cell programming technique causes successive pulses of programming voltage to be applied to the cell with verifying reads of the state of the cell being made in between the pulses. Once the cell is verified to have reached the programmed state, the program pulses are terminated. The program-verify technique implemented by the circuit of FIG. 2, on the other hand, monitors the state of the addressed cell simultaneously with the programming current $I_{CELL}$ being applied to it. The transistors M0, M4, M5 and the addressed cell are connected in series during programming between the programming source $V_{PP}$ and ground potential in a voltage divider. Since the current $I_{CELL}$ through the addressed cell decreases as its floating gate acquires more negative charge during its programming, as shown by the solid curve of FIG. 6, the voltages at various nodes along this voltage divider also vary proportionately. The line 43 of FIG. 2 that is designated to monitor such a varying voltage $V_{OUT}$ is connected to the drain of the driving transistor M0.

The solid curve of FIG. 4 shows the variation of that output voltage as a function of the floating gate charge level of the addressed memory cell being programmed. The sense amplifier 45 (FIG. 1) receives that voltage $V_{OUT}$ and compares it to the reference voltage $V_{REF}$. As indicated on FIG. 4, the output and reference voltages are preferably normalized by designating a "zero" voltage (x-axis) to be that where the charge level on the cell floating gate is neutral, or zero volt (y-axis). The dashed curve of FIG. 4 shows a typical voltage characteristic of a cell being programmed without the current limiting feature of the programming driver 33. The current limitation of the present invention results in less cell current, a resulting greater output voltage swing and thus a more accurate indication of the current state of a cell that is being programmed.

Although the source 47 (FIG. 1) of the reference voltage $V_{REF}$ can be a fixed voltage source, the circuit of FIG. 5 is preferred for most applications. The most sensitive element that controls the level of the output voltage $V_{OUT}$ is the driving transistor M0 because most of the voltage drop being sensed occurs across M0. Variations in the characteristics of that transistor that often result among integrated circuit chips from different wafers, particularly from wafers processed in different batches, will thus cause variations in the voltage output levels that have nothing to do with the programming of cells. If the reference $V_{REF}$ to which this output voltage $V_{OUT}$ is compared by the sense amplifier 45 remains fixed, such variations result in the solid curve of FIG. 4 moving up or down with respect to the breakpoint $V_{REF}$ between programmed states. This can result in the cells of circuits from different wafers being programmed to different levels.

Accordingly, the reference voltage circuit of FIG. 5 includes a transistor M6 that is a replica of the program driving transistor M0 (FIG. 2). That is, the size of its channel, the thickness of its gate dielectric, and other factors that can vary during the processing of different wafers and which affect the amount of voltage drop across the driving transistor M0, are made to be the same in the resistor M6. The gate of transistor M6 is connected to the bias voltage $V_{BP}$, as is the driving transistor M0 during programming. Transistors M7 and M8 are replicas of the mux transistors M4 and M5, and are held in a conductive state by their gates being connected to the program voltage $V_{PP}$. Another transistor M9 is given the characteristics of one of the memory cells. A series circuit of the transistors M6, M7, M8 and M9, connected between the programming voltage $V_{PP}$ and ground potential, simulates the voltage divider of the circuit of FIG. 2. The output $V_{REF}$ in FIG. 5 is taken at the drain of the transistor M6, corresponding to $V_{OUT}$ being monitored at the drain of the transistor M0 in FIG. 2. Since process variations in the formation of M0 affect the level of $V_{OUT}$ the most, corresponding variations in the replica M6 cause the reference level $V_{REF}$ to track any resulting variations in $V_{OUT}$.

The current $I_{REF3}$ through the series circuit of transistors in FIG. 5 is controlled by another current mirror circuit including transistors M9 and M10. A controlled current $I_{REF2}$ from a current source 57 is passed through the transistor M10 between a voltage source $V_{DD}$ and ground potential. An amount of this current is mirrored into the transistor M9 according to a ratio of the relative sizes of the transistors M9 and M10. The reference voltage level $V_{REF}$ is thus controlled by the level of $I_{REF2}$ from the current source 57, which is chosen to provide the desired reference voltage.

Although the various aspects of the present invention have been described with respect to the certain specific embodiments, it will be understood that the invention is entitled to protection within the full scope of the appended claims.

It is claimed:

1. In an array of floating gate transistor memory cells having bit lines individually connected to a column of said cells and word lines individually connected to a row of said cells, a program driving circuit connectable to individual ones of the bit lines to provide, in response to an active programming signal, a programming current to a cell connected thereto that is addressed by a proper voltage on its word line, comprising:

a first transistor connected between the bit line and a programming voltage supply, said first transistor having a source connected with the programming voltage supply and a gate whose voltage controls a level of conduction through said first transistor, a reference current supply, and a second transistor connected to the reference current supply and the first transistor in a manner, when the programming signal is active, to mirror a controlled current through the second transistor to the first transistor, thereby to limit a maximum value of the bit line current during programming of an addressed cell connected to the bit line.

2. The programming driving circuit according to claim 1, wherein the second transistor is connected between the reference current supply and the programming voltage supply, said second transistor having a gate connected to a drain thereof, and a circuit interconnects the gates of the first and second transistors with the programming signal (a) to connect the gate of the first transistor to the programming voltage supply when the programming signal is inactive, and (b) to connect the gates of the first and second transistors together when the programming signal is active, thereby to mirror a current in the second transistor from the reference current supply into the first transistor in a proportional amount dependent upon relative sizes of the first and second transistors.

3. The programming driving circuit according to either one of claims 1 or 2, wherein each of the first and second transistors are of a p-mos type.

4. The programming driving circuit according to claim 1, which additionally comprises a sense amplifier that provides a binary output of a value dependent upon the relative values of first and second inputs, the first input being connectable to the bit line and the second input being connected to a reference source, wherein said sense amplifier output value is related to a programmed state of the addressed cell connected to the bit line.

5. The programming driving circuit according to claim 4, wherein the reference source includes:

a series circuit of a third transistor and a fourth transistor connected between the programming voltage supply and a reference potential, said series circuit providing a reference potential that is connected to the sense amplifier second input, a fifth transistor connected with the fourth transistor and a second current source in a manner to mirror a current through the fifth transistor to the fourth transistor in an amount dependent upon relative sizes of the fourth and fifth transistors, and the second input of the sense amplifier being connected to said series circuit.

6. The programming driving circuit according to claim 5, wherein said third transistor has a gate connected to the gate of the second transistor.

7. The programming driving circuit according to claim 5, wherein the first and third transistors are formed on a single integrated circuit chip to be of the same type and size.

8. The programming driving circuit according to claim 7, wherein said first and third transistors are of a p-mos type.

9. In an array of floating gate transistor memory cells having bit lines individually connected to a column of said cells and word lines individually connected to a row of said cells, a program driving circuit connectable to individual ones of the bit lines to provide, in response to an active programming signal, a programming current to a cell connected thereto that is addressed by a proper voltage on its word line, comprising:

a driving transistor connected in series between the bit line and a source of programming voltage, said driving transistor being of a p-mos type with a gate whose voltage controls a level of conduction through the driving transistor, a reference current supply, a mirroring transistor connected between the reference current supply and the programming voltage supply, said mirroring transistor being of a p-mos type with a gate connected to a drain thereof, and a switching circuit connected between the gates of the driving and mirroring transistors and being responsive to the programming signal (a) to connect the gate of the driving transistor to the programming voltage source when the programming signal is not active, and (b) to connect the gates of the driving and mirroring transistors together when the programming signal is active, in order to mirror a controlled current through the second transistor to the first transistor, and thereby limit a maximum value of the bit line current during programming of an addressed cell connected to the bit line.

10. The programming driving circuit according to claim 9, which additionally comprises a sense amplifier that provides a binary output of a value dependent upon the relative values of first and second inputs, the first input being connectable to the bit line and the second input being connected to a reference source, wherein said sense amplifier output value is related to a programmed state of the addressed cell connected to the bit line, said reference source including:

a series circuit of a first transistor and a second transistor connected between the programming voltage supply and a reference potential, said first transistor being of a p-mos type, having substantially the same size as the driving transistor and having a gate connected with the gate of the mirroring transistor, said series circuit providing a reference potential that is connected to the sense amplifier second input, a third transistor connected between a second current source and a reference and having a gate that is connected with a gate of the second transistor and the second current source, thereby to mirror a level of current through the third transistor to the second transistor in a proportional amount dependent upon relative sizes of the second and third, and the second input of the sense amplifier being connected to the series circuit of said reference source.

11. The programming driving circuit according to claim 10, wherein all of said driving, mirroring, first, second and third transistors are formed on a single integrated circuit chip.

* * * * *